(12) United States Patent
Tzivanopoulos

(10) Patent No.: US 9,383,415 B2
(45) Date of Patent: Jul. 5, 2016

(54) BATTERY SYSTEM HAVING BATTERY CONTACTORS AND A DIAGNOSTIC DEVICE FOR MONITORING THE FUNCTIONAL STATE OF THE CONTACTORS AND ASSOCIATED DIAGNOSTIC METHOD

(71) Applicants: Robert Bosch GmbH, Stuttgart (DE); Samsung SDI Co., Ltd., Yongin-si, Gyeonggi-do (KR)

(72) Inventor: Chrysanthos Tzivanopoulos, Kornwestheim (DE)

(73) Assignee: Robert Bosch GmbH, Stuttgart (DE)

( * ) Notice: Subject to any disclaimer, the term of this patent is extended or adjusted under 35 U.S.C. 154(b) by 405 days.

(21) Appl. No.: 13/950,678

(22) Filed: Jul. 25, 2013

(65) Prior Publication Data

US 2014/0028322 A1 Jan. 30, 2014

(30) Foreign Application Priority Data

Jul. 26, 2012 (DE) .......................... 10 2012 213 159

(51) Int. Cl.
| | |
|---|---|
| *G01N 27/416* | (2006.01) |
| *G01R 31/36* | (2006.01) |
| *G01R 31/327* | (2006.01) |
| *H01M 10/42* | (2006.01) |
| *H01M 10/48* | (2006.01) |

(52) U.S. Cl.
CPC ........ *G01R 31/3606* (2013.01); *G01R 31/3277* (2013.01); *H01M 10/425* (2013.01); *H01M 10/48* (2013.01)

(58) Field of Classification Search
USPC ......................................... 324/433
See application file for complete search history.

(56) References Cited

U.S. PATENT DOCUMENTS

| | | | |
|---|---|---|---|
| 2004/0189307 A1 | 9/2004 | Rudholm et al. | |
| 2011/0140665 A1* | 6/2011 | Tamezane | H02J 7/0016 320/118 |

FOREIGN PATENT DOCUMENTS

| | | |
|---|---|---|
| CN | 102269790 A | 12/2011 |
| DE | 10 2010 041 998 A1 | 4/2012 |
| EP | 2 308 714 A2 | 4/2011 |

* cited by examiner

*Primary Examiner* — Robert Grant
(74) *Attorney, Agent, or Firm* — Maginot, Moore & Beck LLP

(57) ABSTRACT

A battery system comprises a battery including a plurality of battery cells and can be connected on an input side to a direct voltage intermediate circuit via at least one contactor, and a diagnostic device configured to diagnose a state of the at least one contactor. The battery system includes a monitoring circuit with a first branch in which the at least one contactor is arranged, and a second branch which is connected parallel thereto and in which a voltage source configured to generate a reference voltage is connected. The diagnostic device is arranged so as to evaluate a diagnostic current which is dependent on the reference voltage and flows in the monitoring circuit, and serves to determine a fault state of the at least one contactor based on a measured current value or a current profile of the diagnostic current.

9 Claims, 6 Drawing Sheets

BATTERY SYSTEM HAVING BATTERY CONTACTORS AND A DIAGNOSTIC DEVICE FOR MONITORING THE FUNCTIONAL STATE OF THE CONTACTORS AND ASSOCIATED DIAGNOSTIC METHOD

This application claims priority under 35 U.S.C. §119 to patent application no. DE 10 2012 213 159.0, filed on Jul. 26, 2012 in Germany, the disclosure of which is incorporated herein by reference in its entirety.

BACKGROUND

The present disclosure relates to a battery system which has a battery which comprises a plurality of battery cells and which can be connected on the input side to a direct voltage intermediate circuit via at least one contactor, and a diagnostic device for diagnosing the state of the at least one contactor. In addition, the disclosure relates to an associated method for diagnosing the state of battery contactors.

It has become apparent that in future new battery systems of which very stringent demands are made in terms of reliability will be increasingly used both in stationary applications, such as, for example, in wind power plants, and in motor vehicles, such as, for example, in hybrid vehicles and electric vehicles. The background to these stringent demands is that failure of the battery of a battery system which is used can lead to a safety-related problem. The basic circuit diagram of such a battery system 10 is illustrated in FIG. 1. In order to achieve the required performance and energy data by means of the battery system 10, individual battery cells 21 are connected in series and partially additionally in parallel in the battery (battery pack) 20 of the battery system 10. In order to simplify the illustration, only a single battery cell with a reference symbol 21 has been provided in FIG. 1. A problem of the approach shown in FIG. 1, in which a large number of battery cells 21 are connected in series, is the high output voltage UB of a battery (high voltage battery) 20 which occurs with this series connection, which output voltage UB is continuously present at the on-board power system (high-voltage on-board power system) 40 of a motor vehicle unless suitable measures are used. The voltage, referred to as the "link voltage", which is present at the on-board power system 40 has been denoted by UBN in FIG. 1. In the battery system 10 illustrated in FIG. 1, the battery 20 is connected to the on-board power system 40 of the motor vehicle by means of the capacitor 30 of a direct voltage intermediate circuit.

Because of the high voltage UBN, which is continuously present at the on-board power system 40 of the motor vehicle unless suitable measures are used, as a rule contactors 50, 60 are used which, when necessary, disconnect the battery 20 from the on-board power system 40. For safety reasons, a separate contactor 50, 60 should be respectively present both at the positive pole of the battery 20 and at the negative pole, which contactors 50, 60 are designed for a high battery voltage UB and are, under certain circumstances, also capable of disconnecting a short circuit current of over 1000 A. The contactor 50 is connected at its pole 51 to the battery 20, and at its pole 52 to the on-board power system 40. The contactor 60 is connected at its pole 61 to the battery 20, and at its pole 62 to the on-board power system 40.

So that the disconnection of the battery 20 with its high battery voltage UB from the on-board power system 40 is ensured, one of the previously described safety requirements involves checking the function of the contactors 50, 60 and reliably diagnosing a malfunction. Therefore, a particularly hazardous malfunction of the contactors 50, 60 which has to be diagnosed is, for example, if the contactors 50, 60 or the contactor contacts thereof stick during correct actuation and have not opened as actuated. The contactors 50, 60 may also have been destroyed to such an extent that they have not closed as actuated. For the implementation of diagnostic functions it is necessary to use suitable devices and algorithms.

According to the present prior art, topologies are known for implementing anti-sticking diagnostic functions which are embodied as a circuit device for implementing voltage measurements at the four contact poles of the two contactors and which are respectively arranged at the positive or the negative battery pole, between the corresponding battery pole and the on-board power system. Such circuit topologies are known, for example, from document EP 2 308 714 A2. The known circuit topologies may also include reference voltages which are connected when there are certain diagnostic configurations. In the case of open contactors, the potential differences between the four poles of the two contactors are evaluated. These potential differences are predefined, to a certain extent, by means of defined impedances or resistance dividers/voltage dividers.

The methods which are known from the prior art for diagnosing a sticking state of contactors which use considerations of voltage differences as a function of the switched states have the disadvantage that they are very sensitive to voltage cross-couplings between the pole potentials. In addition, these methods are very sensitive to changes in impedance between the battery poles and the on-board power system poles. Furthermore, a complete diagnosis requires a switching frequency to be implemented with simultaneous evaluation of voltage differences. Such a sequence is run through as a rule either at the start or at the end of a driving cycle. Since switching times have to be complied with for this purpose and transient recovery processes play a role, starting delays often occur, depending on the method, specifically until the diagnosis is completed.

Furthermore, document DE 10 2004 041 998 A1 discloses a method for predicting the operational capability of a relay or of a contactor in which a current which flows through the relay or the contactor is measured repeatedly. In the same method, a current temperature of the relay of the contactor is estimated by means of the measured current values and on the basis of known current temperature characteristic curves of the relay or of the contactor. A prediction about the operational capability, in particular about a sticking state, of the relay or of the contactor is then made by means of the estimated temperature.

SUMMARY

According to the disclosure, a battery system is made available which has a battery which comprises a plurality of battery cells and which can be connected on the input side to a direct voltage intermediate circuit via at least one contactor. In addition, the battery system has a diagnostic device for diagnosing the state of the at least one contactor. In addition, a monitoring circuit, which comprises a first branch in which the at least one contactor is arranged and a second branch which is connected parallel thereto and in which a voltage source for generating a reference voltage is connected, is arranged in the battery system. The diagnostic device is arranged so as to evaluate a diagnostic current which is dependent on the reference voltage and flows in the monitoring circuit, and so as to determine the functional state, in particular a fault state, of the at least one contactor by means of a measured current value or current profile of the diagnostic current.

According to the method according to the disclosure for diagnosing the state of battery contactors of a battery, a state diagnosis of at least one of the contactors is carried out by means of a monitoring circuit which has a first branch in which the at least one contactor is arranged, and a second branch which is parallel thereto and in which a voltage source for generating a reference voltage is connected. According to the method, a diagnostic current which is dependent on the reference voltage and which flows in the monitoring circuit is evaluated.

In concrete terms, a battery system having a specific additional monitoring circuit and a diagnostic device is disclosed, wherein the diagnostic device is designed to diagnose a fault state of the contactor. To be more precise, the battery system and the diagnostic device are designed to respectively measure a diagnostic current, flowing through the connected, second branch of the monitoring circuit, for the contactor in a first state, assumed to be an opened switched state, and in a second state, assumed to be a closed switched state, and to be able to diagnose a malfunction of the contactor, in particular a sticking state of the contactor, by means of the measured diagnostic current.

As a result, according to the disclosure, a switching topology is made available which is optimized in terms of costs and resources and which permits a particularly robust diagnosis of a contactor which is used in the open or closed state. The switching topology according to the disclosure makes it possible to implement continuous monitoring of the state of the contactors and contactor contacts used in the closed state and rapid checking in the opened state, which monitoring and checking cause only a very short starting delay since only one switching and measuring process per contactor is respectively required.

In particular, the battery system according to the disclosure can comprise two contactors which are each arranged on the battery pole and are each positioned in an additional monitoring circuit, and the diagnostic device is designed to respectively measure the diagnostic currents which flow through the second connected branches of the two monitoring circuits, while the two contactors are each in the second state, assumed to be a closed switched state, and to respectively diagnose a possible malfunction of the contactors by means of the measured diagnostic currents.

If both contactors are operationally capable and are in the closed switched state, a diagnostic current which is defined by the structure of the corresponding monitoring circuit must flow in each monitoring circuit. The functional state of the respective contactor can be inferred by means of the measured values of the diagnostic currents. If the expected diagnostic currents are measured in both monitoring circuits, it is possible to assume that both contactors have closed satisfactorily. If a different diagnostic current is measured in at least one monitoring circuit, a fault state of the corresponding contactor in which this contactor has not closed can be diagnosed by evaluating the measured diagnostic currents.

The battery system according to the disclosure can comprise two contactors which are each arranged on a battery pole and are each positioned in an additional monitoring circuit, and the diagnostic device is designed to measure the diagnostic current which flows through the connected second branch of the monitoring circuit of at least one contactor in the first state, assumed to be an opened switched state, while the monitoring circuit of the other contactor is in the second state, assumed to be a closed switched state, and to diagnose a possible sticking state of the corresponding contactor by means of the measured diagnostic current.

The diagnostic device is preferably designed to carry out the measurement of the diagnostic current through the second connected branch of the monitoring circuit of a contactor in the first state, assumed to be an opened switched state, directly after both monitoring circuits were in the second state, assumed to be the closed switched state.

In other words, one of the two contactors is opened after both connectors were closed. The diagnostic current which flows through the second, connected branch of the monitoring circuit of the opened contactor is measured here and evaluated. If the corresponding contactor has opened satisfactorily, the corresponding diagnostic current is reduced, in particular is reduced to zero, that is to say is disconnected. If this contactor contact sticks, the contactor remains closed even after the opening process and the corresponding diagnostic current approximates to the expected diagnostic current in the closed state of the contactor.

According to the disclosure, a sticking state which is occurring at the examined contactor can easily be diagnosed by means of the measured diagnostic current. This measurement can be carried out for each of the two contactors.

In particular, the battery system according to the disclosure comprises, according to one embodiment of the disclosure, two contactors which are each arranged on a battery pole and are each placed in an additional monitoring circuit, and the diagnostic device is designed to measure the diagnostic current which flows through the connected, second branch of the monitoring circuit of at least one contactor in the first state, assumed to be an opened switched state, while the other contactor is also in the first state, assumed to be an opened switched state, and the second branch of the monitoring circuit of the other contactor is disconnected from the first branch of the monitoring circuit of the other contactor. In addition, the diagnostic device is designed to diagnose a possible sticking state of the corresponding contactor by means of the measured diagnostic current.

In other words, one of the contactors is opened and the second branch of the monitoring circuit of this contactor is disconnected, while the other contactor is opened and the second branch of the monitoring circuit of this other contactor is connected. In this context, the diagnostic current which flows through the second connected branch of the corresponding monitoring circuit is measured. If no diagnostic current is detected flowing through the second connected branch of the corresponding monitoring circuit, it can be assumed that both contactors have opened satisfactorily. If the contactor contact for which the diagnostic current is measured sticks, this contactor remains closed even after the opening process and the corresponding diagnostic current approximates to the expected diagnostic current in the closed state of the contactor. The sticking state of the examined contactor can be diagnosed by means of this measured diagnostic current. This measurement can be carried out for each of the two contactors.

In particular, in the second branch of at least one monitoring circuit of the battery system according to the disclosure a shunt resistor is connected in series with the additional voltage source of the monitoring circuit. In addition, in this context the diagnostic device is designed to measure the voltage which is present at the shunt resistor and to use it to determine a corresponding diagnostic current flowing through the shunt resistor.

According to the disclosure, the diagnostic currents can therefore be determined by means of a simple evaluation of the voltages present at the corresponding shunt resistors.

At least one monitoring circuit of the battery system according to the disclosure preferably comprises a potential-separated voltage source which can be embodied as a winding of a flyback converter.

By using a potential-separated voltage source for at least one monitoring circuit, the probability of the occurrence of voltage cross-couplings between pole potentials, which would have a considerable adverse effect on the diagnosis of a possible false state of the contactors used, is drastically reduced in a very easy way with the circuit technology according to the disclosure.

According to one preferred embodiment of the disclosure, the voltage source is connected in an orientation which is opposed to the orientation of the battery voltage. In another embodiment, the voltage source is connected with the same orientation as the battery.

In addition, the second branch of the monitoring circuit can have a plurality of reference resistors and/or a diode, which are arranged in a series circuit with the voltage source. In this context, the diode is preferably poled in series with the battery cells with respect to its direction of flow.

A second inventive branch of a monitoring circuit is preferably designed such that it can be deactivated, in particular by means of a switch arranged in the second branch.

In one very preferred embodiment of the battery system according to the disclosure, the diagnostic device comprises at least one analog/digital converter and an evaluation unit for evaluating digital signals which can be embodied, in particular, as microcontrollers, wherein the analog/digital converter is designed to convert a detected diagnostic current or a voltage which is present and detected at the shunt resistor into a digital signal and to transfer the digital signal, in particular to transfer it with separated potentials, to the evaluation unit. In this context, the microcontroller can be embodied within the electronics of the battery management system.

Since the analog/digital converter is designed to transfer the digital signal of the evaluation unit with separated potentials, with the circuit topology according to the disclosure the probability of the occurrence of destructive voltage cross-couplings between pole potentials is easily minimized.

According to one preferred development of the method according to the disclosure, a closed state of a contactor is diagnosed if the measured diagnostic current corresponds to a predefined reference resistor arranged of the reference voltage and in the monitoring circuit, in particular in the second branch of the monitoring circuit, wherein opening of the contactor is diagnosed if a reduction occurs in the measured diagnostic current, in particular a reduction to the value zero.

This development according to the method can be carried out with the battery system according to the disclosure, in which the reference voltage source has opposed poling to that of the battery. On the other hand, if the reference voltage source is poled with the battery, the method can also be carried out in such a way that an initially increasing current indicates opening of the contactor.

Furthermore, according to the method a satisfactory open state of a contactor can be diagnosed if, in response to a connection of the second branch, which is performed, for example, by a switch arranged in the second branch, it is not possible to measure any diagnostic current which differs from zero. In this context, a malfunction, in particular sticking of the contactor, can be diagnosed if a diagnostic current which differs from the current value zero is measured in response to the connection of the second branch.

This embodiment of the method is preferably carried out in such a way that when the second branch is connected the other second branch, which is associated with another contactor, remains open, that is to say disconnected.

The battery which forms part of the battery system according to the disclosure is preferably a lithium ion battery.

Yet a further aspect of the disclosure relates to a motor vehicle having the battery system according to the disclosure. The use of the battery system according to the disclosure in a motor vehicle, in particular for supplying the on-board power system of the motor vehicle, considerably improves the driving safety of such a motor vehicle.

Advantageous developments of the disclosure are specified in the dependent claims and described in the description.

BRIEF DESCRIPTION OF THE DRAWINGS

Exemplary embodiments of the disclosure are explained in more detail by means of the drawings and the following description. In the drawings.

DETAILED DESCRIPTION

Figure 1:
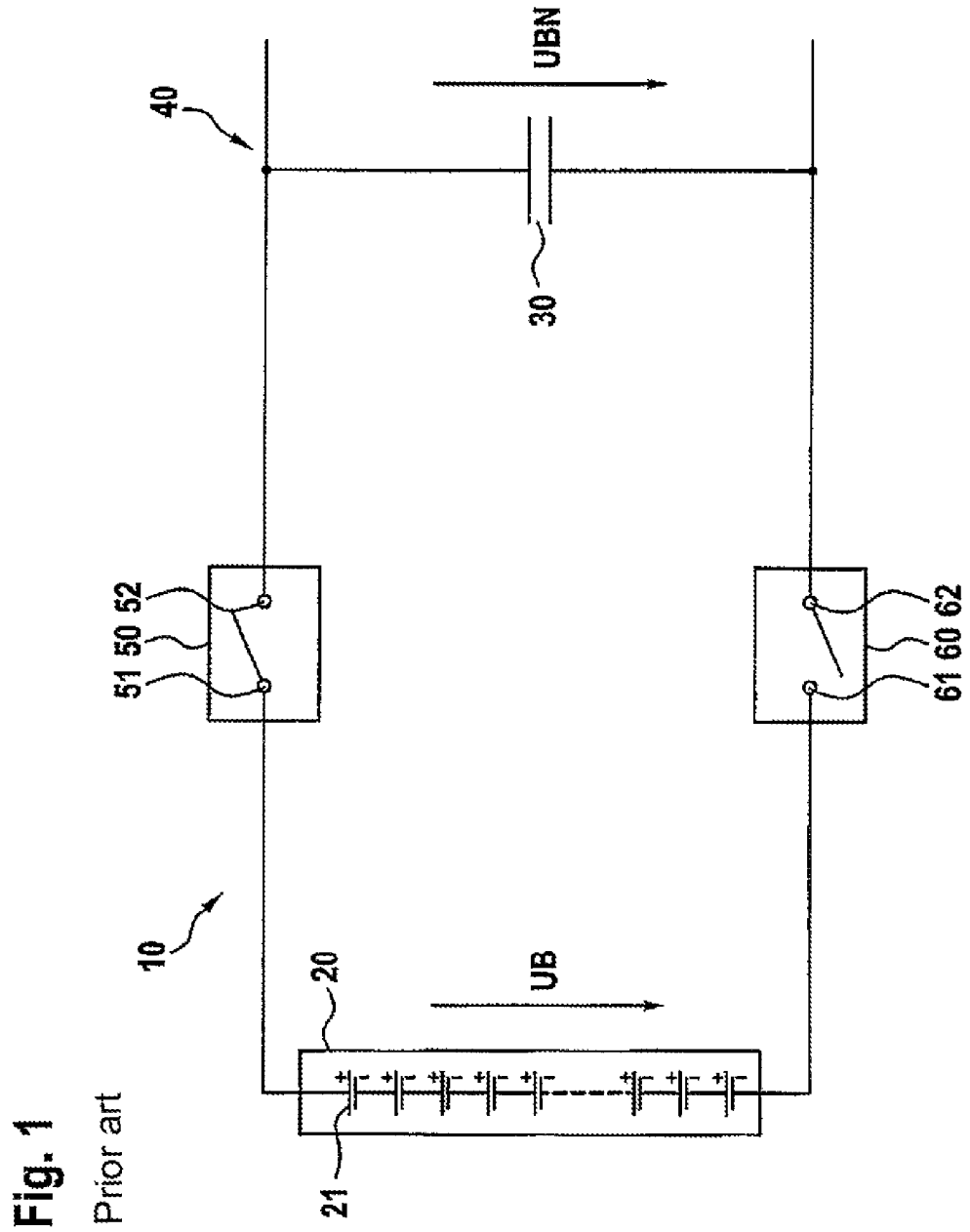
FIG. 1 shows a battery system which is known from the prior art and has a battery with a plurality of battery cells, wherein a contactor is arranged at each of the battery poles.
Figure 2:
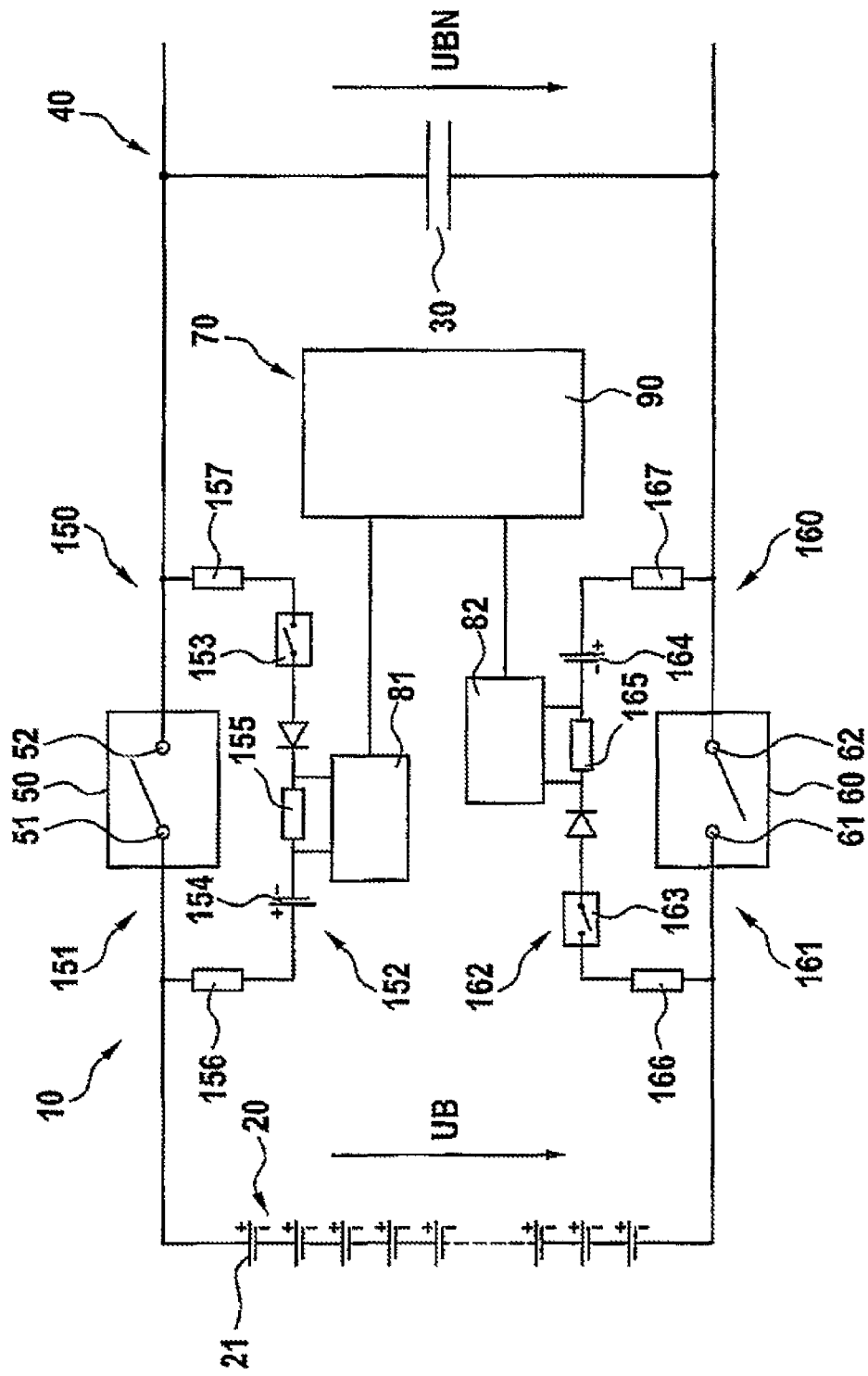
FIG. 2 shows a battery system according to a first embodiment of the disclosure with a battery with a plurality of battery cells, wherein a contactor which is positioned in a separate monitoring circuit is arranged at each of the battery poles.

FIG. 2 illustrates the basic circuit diagram of a battery system 10 according to a first embodiment of the disclosure. The battery system 10 comprises a battery 20 with a plurality of battery cells 21 which are connected in series and partially additionally in parallel. In order to simplify the illustration, just one of the illustrated battery cells is provided with a reference symbol 21 in FIG. 1. The output voltage of the battery 20 is also denoted by UB here. In the battery system 10 illustrated in FIG. 1, the battery 20 can be connected to the on-board power system 40 of a motor vehicle via two contactors 50, 60 by means of the capacitor 30 of a direct voltage intermediate circuit. If both contactors 50, 60 are functionally capable and are each in a closed state, the battery voltage UB is present at the on-board power system (high-voltage on-board power system) 40 of the motor vehicle. The voltage (link voltage) which is present at the on-board power system 40 is denoted by UBN in FIG. 2.

The contactors 50, 60 can, if they are functionally capable and in the opened state, disconnect the battery 20 from the on-board power system 40. The contactor 50 is connected at its pole 51 to the positive battery pole (not characterized) and at its pole 52 to the on-board power system 40. The contactor 60 is connected at its pole 61 to the negative battery pole (not characterized) and at its pole 62 to the on-board power system 40. The diagnostic voltages which are present at the poles 51, 52 of the contactor 50 and at the poles 61, 62 of the contactor 60 are denoted by UD1 and UD2, respectively.

In the battery system 10 according to the first embodiment of the disclosure, each of the two contactors 50, 60 is positioned in an additional monitoring circuit 150, 160 which can be disconnected. Each of these monitoring circuits 150, 160 comprises a first branch 151, 161 in which the corresponding contactor 50, 60 is arranged, and a second branch 152, 162 which can be connected in parallel with the corresponding first branch 151, 161 in each case by means of a switch 153, 163 and comprises a separate potential-separated voltage source 154, 164 which is connected in series with the corresponding switch 153, 163 and which respectively supplies the corresponding monitoring circuit 150, 160. The potential-separated voltage sources 154, 164 each supply a known reference voltage UR1 and UR2, respectively. The potential-separated voltage sources 154, 164 can be implemented cost-effectively by means of, for example, a separate winding of a flyback converter.

If a contactor 50, 60 is closed, a defined diagnostic current flows in the corresponding monitoring circuit 150, 160, which diagnostic current can be detected by means of a diagnostic device 70 arranged in the battery system 10. This can be implemented, for example, by virtue of the fact that the two branches 152, 162 of the monitoring circuits 150, 160 each comprise a shunt resistor 155, 165 which is connected in series with the corresponding voltage source 154, 164, and the voltage which is present at a shunt resistor 155, 165 is detected and evaluated by means of the evaluation unit 90 for the purpose of determining the diagnostic current flowing through the corresponding shunt resistor. The resistance values of the shunt resistors 155, 165 are denoted by RS1 and RS2. In addition, each of the second branches 152, 162 of the monitoring circuits 150, 160 can respectively comprise two further resistors 156, 157 and 166, 167, respectively, which are connected in series with the respective second branch 152, 162 and whose resistance values are denoted by R1, R2 and R3, R4, respectively, in the drawing.

The voltage which is present at a shunt resistor 155, 165 can be respectively made available by an analog/digital converter 81, 82 which is arranged in the evaluation unit 90, with potential separation, which analog/digital converter 81, 82 converts this voltage which is made available into a digitized signal and transfers the digitized signal with potential separation to a microcontroller, arranged in the evaluation unit 90, for the purpose of evaluation. The state of the contactor 50, 60 monitored in this way can be inferred by means of the evaluation of the digitized signal.

Figure 3:
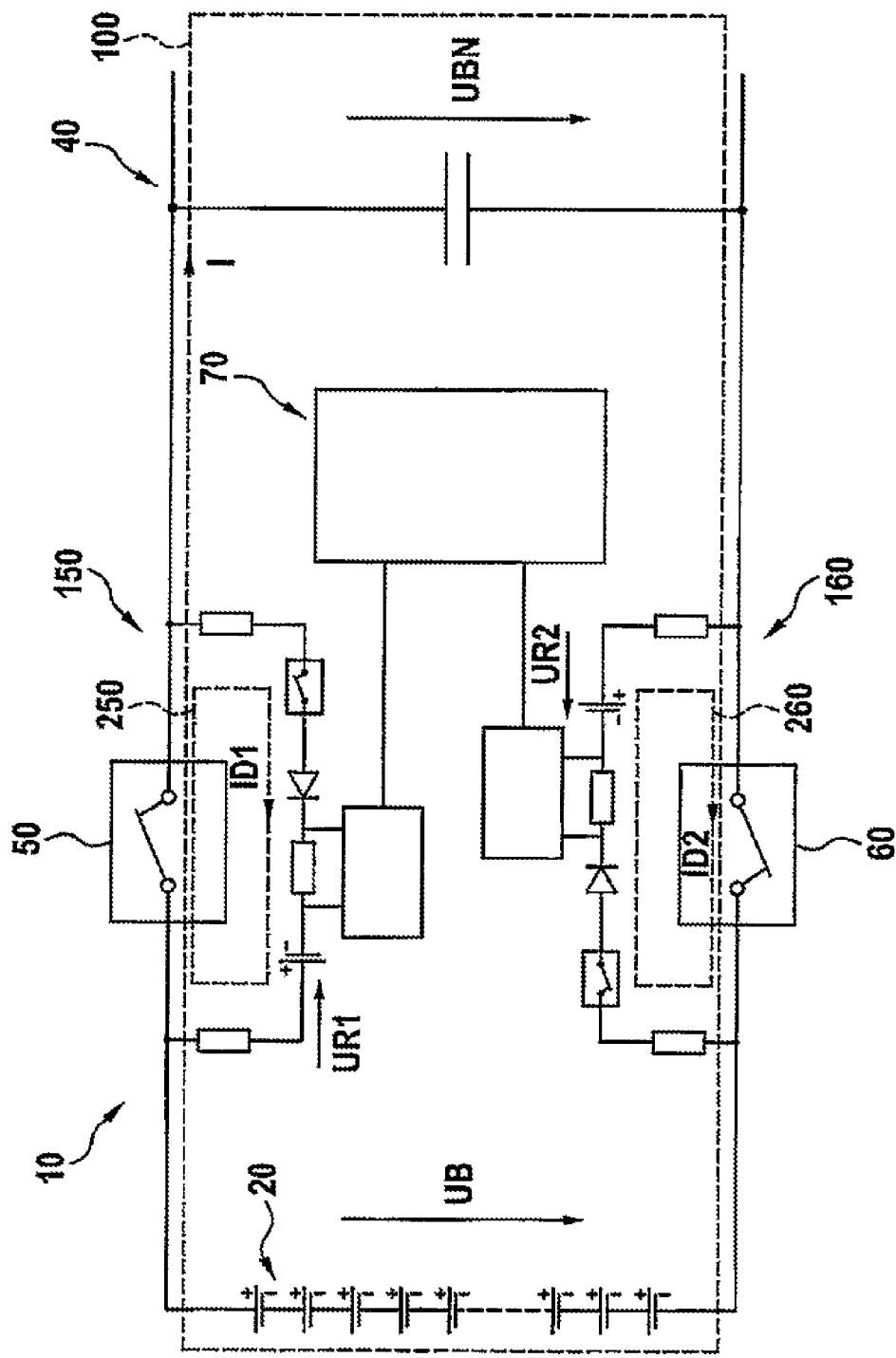
FIG. 3 shows a battery system according to the first embodiment of the disclosure together with the current flows at the monitoring circuits with the contactors at the battery poles closed.

FIG. 3 shows the battery system 10 (illustrated in FIG. 2) according to the first embodiment of the disclosure together with the current flows at the monitoring circuits 150, 160 for a case in which both contactors 50, 60 which are arranged at the battery poles and the associated monitoring circuits 150, 160 are closed. For the purpose of simplifying the illustration, in FIG. 3 all voltages and currents which occur and which are relevant for the description of the current flows at the monitoring circuits 150, 160 were provided with reference symbols only for the other components which are mainly discussed here.

The monitoring of the contactors 50, 60 in the "closed" setpoint state is described in more detail with reference to FIGS. 3 and 4.

If the contactors 50, 60 are closed, a defined diagnostic current flows in each monitoring circuit 150, 160. The values of the diagnostic currents ID1, ID2 flowing through the second branches 152, 162 are specified in the relations (1) and (2). The current flows which are respectively present in the monitoring circuits 150, 160 are denoted by 250 and 260 in FIG. 3. In addition, in FIG. 3 the current flow which passes via the contactor 60, via the battery 20, via the contactor 50 and via the input of the on-board power system 40 was denoted by 100. The current which is associated with the current flow 100 is denoted by I.

The following relationship (1) relates to the monitoring circuit 150 of the contactor 50 which is arranged at the positive battery pole:

$$ID1=(UR1-UD1)/(R1+R2+RS1) \qquad (1)$$

The relationship (2) relates to the monitoring circuit 160 of the contactor 60 which is arranged at the negative battery pole:

$$ID2=(UR2-UD2)/(R3+R4+RS2) \qquad (2)$$

Figure 4:
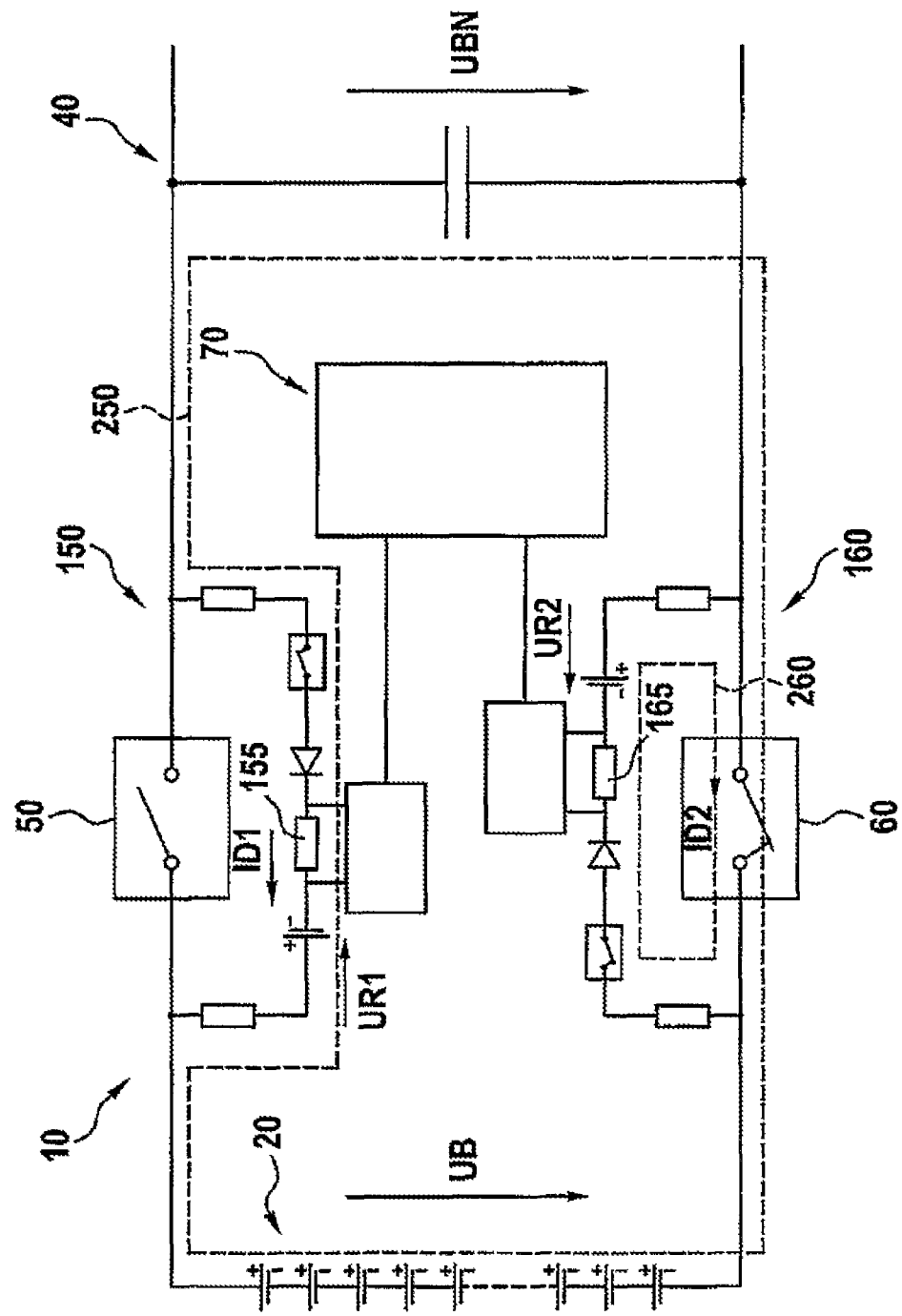
FIG. 4 shows the battery system according to the first embodiment of the disclosure together with the current flows at the monitoring circuits with the contactor at the positive battery line pole opened and the contactor at the negative battery pole closed.

FIG. 4 shows the battery system 10 (illustrated in FIG. 2) according to the first embodiment of the disclosure together with the current flows at the monitoring circuits 150, 160 for the case in which the contactor 50 which is arranged at the arranged positive battery pole is opened, the second branch 152 of the associated monitoring circuit 150 is connected and the contactor 60 which is arranged at the negative battery pole and the associated monitoring circuit 160 are closed. In order to simplify the illustration, all the voltages and currents which occur and which are relevant for the description of the current flows at the monitoring circuits 150, 160 are again provided with reference signs only for various selected components. The values of the diagnostic currents which flow through the second branches 152, 162 of the monitoring circuits 150, 160 are also denoted by ID1 and ID2 here. In FIG. 4, the current flow which, because the contactor 50 is opened, passes via the second branch 152 of the monitoring circuit 150 and additionally also via the battery 20, via the contactor 60 and via the input of the on-board power system 40 is denoted by 250 in FIG. 4.

In FIG. 4, the current flows 250, 260 are illustrated for the case in which, directly after the two contactors 50, 60 and the associated monitoring circuits 150 and 160 were closed, one of the two contactors 50, 60, here the contactor 50 arranged at the positive battery pole, has been opened.

If a contactor opens, the associated diagnostic current, here ID1, will be reduced and, under certain circumstances, disconnected as soon as the on-board power system voltage UBN, that is to say the high voltage present at the on-board power system, becomes lower than the battery voltage UB.

In the following relationship (3), the value of the diagnostic current ID1 which is associated with the current flow 250 is specified:

$$ID1=((UR1-UD2-(UB-UBN))/(R1+R2*RS1) \qquad (3)$$

As soon as the on-board power system voltage UBN becomes lower than the difference (UB−UR1) between the battery voltage UB and the reference voltage UR1, the current flow 250 is completely disconnected.

The evaluation of the digitized voltage drop at the measuring shunt resistor 155 whose resistance value is denoted by RS1 here makes it possible for the diagnostic current ID1 to be monitored and for opening of the contactor 50 to be diagnosed immediately as soon as the diagnostic current changes or fails entirely. When the contactor 50 is opened, the diagnostic current will change immediately as soon as the on-board voltage UBN changes in comparison with the on-board voltage value in the closed state of the contactor 50.

The same measurement principle can be applied for the contactor 60 if the contactor 60 is opened directly after the contactors 50, 60 and the associated monitoring circuits 150, 160 were closed.

The monitoring of the contactors 50, 60 in the "open" setpoint state is described in more detail below with reference to FIGS. 5 and 6. In the case of the "contactors open" setpoint state the objective is to diagnose whether a contactor 50, 60 is not open as it should be but instead sticking. For this purpose, one measurement should be carried out per contactor 50, 60.

Figure 5:
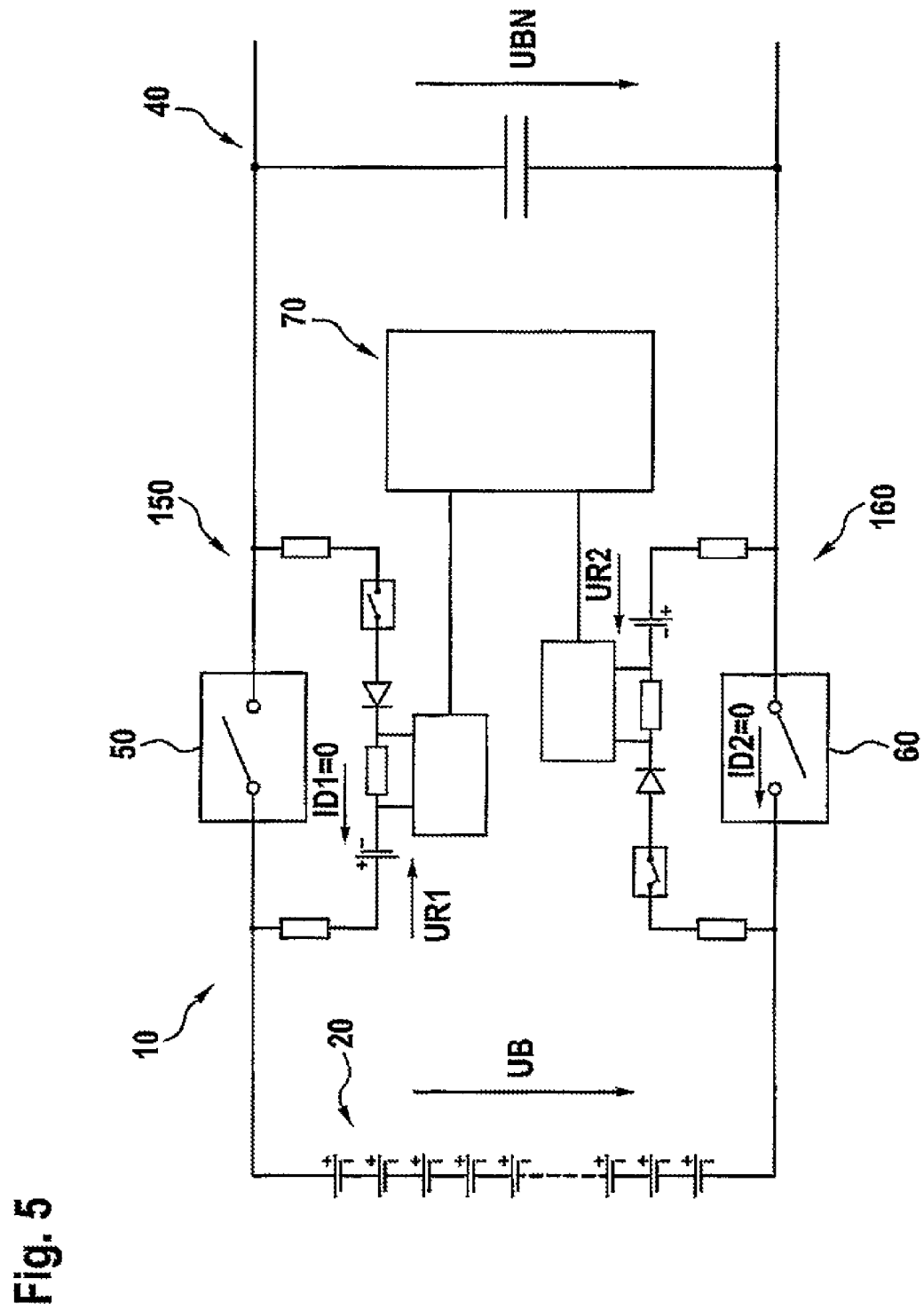
FIG. 5 shows the battery system according to the first embodiment of the disclosure, in which the monitoring circuits with opened contactors on the two battery poles for checking non-sticking of the contactor at the negative battery pole are illustrated.

FIG. 5 shows the battery system 10 (illustrated in FIG. 2) according to the first embodiment of the disclosure for a case in which the monitoring circuits 150, 160 are used with contactors opened at both battery poles for checking for nonsticking of the contactor 60 at the negative battery pole. In order to simplify the illustration, in FIG. 5 all the voltages and currents which occur and are relevant for the description of the states used in the specified case were provided with reference symbols, but only the essential miscellaneous components were provided with reference symbols.

During the measurement for diagnosing the contact state of the contactor 60 at the negative battery pole, the switch 163 of the monitoring circuit 160 of this contactor 60 is closed and the switch 153 of the monitoring circuit 150 of the contactor 50 at the positive battery pole is used in an open switched state. If both contactors 50, 60 are open, a diagnostic current ID1, ID2 cannot flow in any of the monitoring circuits 150, 160. In this case, the relationship (4):

$$ID1=ID2=0 \quad (4)$$

then applies for the diagnostic currents ID1, ID2.

Figure 6:
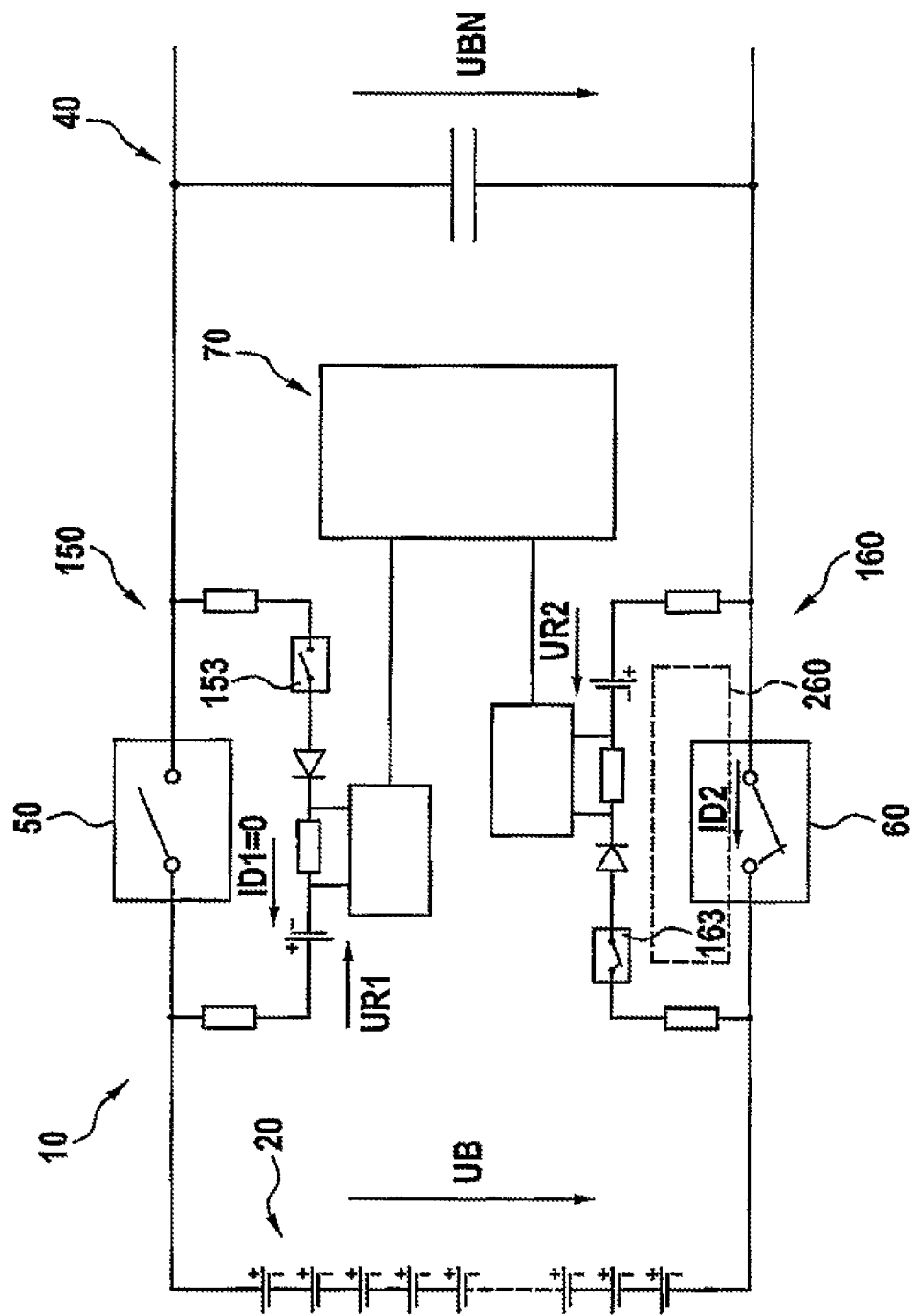
FIG. 6 shows the battery system according to the first embodiment of the disclosure together with the current flows at the monitoring circuits from FIG. 5 for a case in which the contactor at the negative battery pole is sticking.

FIG. 6 shows the battery system 10 according to the first embodiment of the disclosure together with the current flows at the monitoring circuits 150, 160 (illustrated in FIG. 5) for the case in which the contactor 60 at the negative battery pole is sticking. The values of the diagnostic currents flowing through the second branches 152, 162 of the monitoring circuits 150, 160 are also denoted by ID1 and ID2 in FIG. 6. The current flow which, because the contactor 60 is sticking, is present in the monitoring circuit 160 or does not disappear has been denoted by 260 in FIG. 6.

If the contactor 60 which is arranged at the negative battery pole were to stick, a diagnostic current ID2, which has been specified in the relationship (5), would flow through the second branch 162 of a corresponding monitoring circuit 160. The detection of the diagnostic current ID2 makes it possible to diagnose a sticking contactor 60 at the negative battery pole. In this case, no diagnostic current ID1 would flow through the second branch 152 of the monitoring circuit 150 of the contactor 50 arranged at the positive battery pole and the value of this diagnostic current ID1 would therefore be zero.

$$ID2=(UR2-UD2)/(R3+R4+RS2) \quad (5)$$

The measuring procedure for diagnosing a sticking state of the contactor 50 which is arranged at the positive battery pole is analogous to the measuring procedure which has just been presented above, for diagnosing a sticking state of the contactor 60 which is arranged at the negative battery pole.

What is claimed is:

1. A battery system comprising:
   at least one contactor;
   a battery including a plurality of battery cells and defining an input side, the battery being configured to be connected on the input side to a direct voltage intermediate circuit via the at least one contactor;
   a diagnostic device configured to diagnose a state of the at least one contactor; and
   a monitoring circuit including (i) a first branch in which the at least one contactor is located, and (ii) a second branch which is connected parallel thereto and in which a voltage source configured to generate a reference voltage is connected, the second branch further comprising:
   a shunt resistor is connected in series with the voltage source in the monitoring circuit;
   the diagnostic device being configured to measure a voltage drop across the shunt resistor and to determine the diagnostic current based on the measured voltage drop;
   the voltage source being configured as a potential-separated voltage source;
   the potential-separated voltage source being a winding of a flyback converter; and
   wherein the diagnostic device is configured to evaluate a diagnostic current which is dependent on the reference voltage and flows in the monitoring circuit and serves to determine a fault state of the at least one contactor based on a measured current value or a current profile of the diagnostic current.

2. The battery system according to claim 1, wherein:
   the battery includes a plurality of battery poles,
   a contactor of the at least one contactor is arranged at each battery pole of the battery, and
   in each case the battery system includes one embodiment of the monitoring circuit per contactor of the at least one contactor.

3. The battery system according to claim 1, wherein:
   the voltage source is connected in an orientation which is opposed to an orientation of the battery voltage,
   the second branch of the monitoring circuit includes at least one of a plurality of reference resistors, and a diode which are arranged in a series circuit with the voltage source, and
   the diode is poled in series with the battery cells of the plurality of battery cells with respect to a direction of flow of the diode.

4. The battery system according to claim 1, wherein:
   the second branch of the monitoring circuit is configured to be capable of being switched off by a switch, and
   the switch is arranged in the second branch.

5. The battery system according to claim 1, wherein:
   the diagnostic device includes at least one analog/digital converter and an evaluation unit configured to evaluate digital signals,
   the analog/digital converter is configured (i) to convert a detected diagnostic current or a voltage which is present and detected at the shunt resistor into a digital signal, and (ii) to transfer the digital signal to the evaluation unit via a digital signal transfer device or an analog signal transfer device, and
   the evaluation unit includes a microcontroller.

6. A method for diagnosing a state of at least one contactor of a battery, comprising:
   carrying out a state diagnosis of the at least one contactor with a monitoring circuit including a first branch in which the at least one contactor is arranged, and a second branch which is parallel thereto and in which a voltage source configured to generate a reference voltage is connected, the state diagnosis further comprising:
   diagnosing a satisfactory open state of the at least one contactor in response to a diagnostic current not deviating from zero being measured in response to a connection of the second branch, which is performed by a switch which is arranged in the second branch; and diagnosing a malfunction occurring in response to the at least one contactor sticking in response to a diagnostic current deviating from the current value zero being measured in response to the connection of the second branch; and evaluating a measured diagnostic current which is dependent on the reference voltage and flows in the monitoring circuit.

7. The method according to claim 6, further comprising:

diagnosing a closed state of the at least one contactor if the measured diagnostic current corresponds to a predefined reference resistor arranged of the reference voltage and in the monitoring circuit, in particular in the second branch of the monitoring circuit; and diagnosing an opening of the at least one contactor if a reduction occurs in the measured diagnostic current, in particular a reduction to a value zero.

8. The method according to claim 6, wherein when the method is applied to a battery system including a battery in which both battery poles include a contactor of the at least one contactor, the state diagnosis is carried out by evaluating a respective diagnostic current at a time at which both contactors are in a state which is assumed to be closed and/or for diagnosing a possible sticking state of the at least one contactor at a time at which one contactor is in the state which is assumed to be closed and the other contactor is in the state which is assumed to be open, in particular directly after both contactors were in the state which was assumed to be closed, and/or at a time at which both contactors are in the state which is assumed to be open and precisely one of the corresponding second branches is disconnected.

9. A motor vehicle comprising:

a drive train; and a battery system arranged in the drive train and including at least one contactor, a battery including a plurality of battery cells and defining an input side, the battery being configured to be connected on the input side to a direct voltage intermediate circuit via the at least one contactor, a diagnostic device configured to diagnose a state of the at least one contactor, and a monitoring circuit including (i) a first branch in which the at least one contactor is located, and (ii) a second branch which is connected parallel thereto and in which a voltage source configured to generate a reference voltage is connected, the second branch further comprising:

a shunt resistor is connected in series with the voltage source in the monitoring circuit; and the diagnostic device being configured to measure a voltage drop across the shunt resistor and to determine the diagnostic current based on the measured voltage drop;

the voltage source being configured as a potential-separated voltage source; and the potential-separated voltage source being a winding of a flyback converter; and wherein the diagnostic device is configured to evaluate a diagnostic current which is dependent on the reference voltage and flows in the monitoring circuit and serves to determine a fault state of the at least one contactor based on a measured current value or a current profile of the diagnostic current.

\* \* \* \* \*